(12) United States Patent
Oka et al.

(10) Patent No.: US 9,443,950 B2
(45) Date of Patent: Sep. 13, 2016

(54) SEMICONDUCTOR DEVICE

(71) Applicant: TOYODA GOSEI CO., LTD., Kiyosu-shi (JP)

(72) Inventors: Toru Oka, Kiyosu (JP); Nariaki Tanaka, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 39 days.

(21) Appl. No.: 14/104,998

(22) Filed: Dec. 12, 2013

(65) Prior Publication Data
US 2014/0167061 A1 Jun. 19, 2014

(30) Foreign Application Priority Data

Dec. 14, 2012 (JP) .................. 2012-272985

(51) Int. Cl.
| | | |
|---|---|---|
| *H01L 29/06* | (2006.01) | |
| *H01L 29/45* | (2006.01) | |
| *H01L 21/04* | (2006.01) | |
| *H01L 21/285* | (2006.01) | |
| *H01L 29/66* | (2006.01) | |
| *H01L 29/78* | (2006.01) | |
| H01L 29/20 | (2006.01) | |
| H01L 29/16 | (2006.01) | |

(Continued)

(52) U.S. Cl.
CPC .......... *H01L 29/45* (2013.01); *H01L 21/0485* (2013.01); *H01L 21/28587* (2013.01); *H01L 29/452* (2013.01); *H01L 29/66068* (2013.01); *H01L 29/66727* (2013.01); *H01L 29/66734* (2013.01); *H01L 29/7802* (2013.01); *H01L 29/7813* (2013.01); H01L 29/1095 (2013.01); H01L 29/1608 (2013.01); H01L 29/2003 (2013.01); H01L 29/401 (2013.01); H01L 29/41741 (2013.01); H01L 29/41766 (2013.01)

(58) Field of Classification Search
CPC ................... H01L 21/0485; H01L 21/28587; H01L 29/1608; H01L 29/2003; H01L 29/45; H01L 29/452; H01L 29/66068; H01L 29/7827
USPC ................. 257/76–77, 139, 189, 192, 372, 257/382–384, 11, 744, 288, 262, 401, 287, 257/E29.027, E29.028, E33.025, E33.037
See application file for complete search history.

(56) References Cited

U.S. PATENT DOCUMENTS

| | | |
|---|---|---|
| 7,211,839 B2 | 5/2007 | Kachi et al. |
| 7,884,395 B2 | 2/2011 | Saito |

(Continued)

FOREIGN PATENT DOCUMENTS

| | | |
|---|---|---|
| JP | 07-045867 A | 2/1995 |
| JP | 09-064337 A | 3/1997 |

(Continued)

*Primary Examiner* — H Tsai
(74) *Attorney, Agent, or Firm* — McGinn IP Law Group, LLC

(57) ABSTRACT

A semiconductor device includes: a p-type semiconductor layer; an n-type semiconductor layer connected with the p-type semiconductor layer; a first electrode layer formed on the n-type semiconductor layer; and a second electrode layer formed on the p-type semiconductor layer. The first electrode layer and the second electrode layer are electrically connected such as to each operate at an identical potential. The second electrode layer is connected with at least a part of a surface of the first electrode layer which is opposite to a surface of the first electrode layer that is in contact with the n-type semiconductor layer.

23 Claims, 8 Drawing Sheets

(51) Int. Cl.
*H01L 29/40* (2006.01)
*H01L 29/417* (2006.01)
*H01L 29/10* (2006.01)

(56) References Cited

U.S. PATENT DOCUMENTS

| | | |
|---|---|---|
| 8,044,434 B2 | 10/2011 | Ohta et al. |
| 2004/0157355 A1 | 8/2004 | Kachi et al. |
| 2008/0315211 A1 | 12/2008 | Ichikawa et al. |
| 2009/0008679 A1 | 1/2009 | Saito |
| 2010/0006894 A1 | 1/2010 | Ohta et al. |
| 2012/0037922 A1* | 2/2012 | Kono et al. ............ 257/77 |
| 2012/0098030 A1* | 4/2012 | Schulze et al. ........ 257/139 |
| 2012/0181548 A1 | 7/2012 | Okada et al. |
| 2013/0313576 A1* | 11/2013 | Nakano ................. 257/77 |

FOREIGN PATENT DOCUMENTS

| | | |
|---|---|---|
| JP | 2000-12846 A | 1/2000 |
| JP | 2004-260140 A | 9/2004 |
| JP | 2008-53449 A | 3/2008 |
| JP | 2008-205175 A | 9/2008 |
| JP | 2009-004573 A | 1/2009 |
| JP | 2009-9993 A | 1/2009 |
| JP | 2009-117820 A | 5/2009 |
| JP | 2009-212529 A | 9/2009 |
| JP | 2009-266981 A | 11/2009 |
| JP | 2010-109086 A | 5/2010 |
| JP | 2010-238738 A | 10/2010 |
| JP | 2011-82397 A | 4/2011 |
| JP | 5526493 B2 | 6/2014 |
| WO | WO 2012105611 A1 * | 8/2012 |

* cited by examiner

US 9,443,950 B2

SEMICONDUCTOR DEVICE

CROSS REFERENCE TO RELATED APPLICATIONS

The present application claims the priority based on Japanese Paten Application No. 2012-272985 filed on Dec. 14, 2012, the disclosure of which is hereby incorporated by reference in its entirety.

BACKGROUND OF THE INVENTION

1. Technical Field

The present invention relates to a semiconductor device.

2. Description of the Related Art

A known configuration of a semiconductor device has a p-type semiconductor layer and an n-type semiconductor layer connected with the p-type semiconductor layer. An electrode layer formed on the semiconductor layer of this semiconductor device is required to suppress the contact resistance, while ensuring the adhesiveness to the semiconductor layer. In order to meet this requirement, one proposed technique employs an electrode of a layered structure where an aluminum (Al) layer is formed on a titanium (Ti) layer as the electrode layer formed on the n-type semiconductor layer mainly made of gallium nitride (GaN) (see, for example, JP H07-45867A). Another proposed technique employs an electrode of a layered structure where a gold (Au) layer is formed on a nickel (Ni) layer as the electrode layer formed on the p-type semiconductor layer mainly made of gallium nitride (see, for example, JP H09-64337A).

SUMMARY OF THE INVENTION

In the case of forming an electrode (first electrode layer) on the n-type semiconductor layer of the semiconductor device and forming an electrode layer (second electrode layer) on the p-type semiconductor layer, the above prior techniques require that the first electrode layer and the second electrode layer are formed to be isolated from each other according to the overlay accuracy of photolithography for formation of the first electrode layer and the second electrode layer. This requirement limits miniaturization of the semiconductor device. Additionally, the above prior techniques still have room for further improvement with respect to the flexibility in selection of the material for the electrodes. Other demands for the conventional semiconductor device include easiness of manufacturing, resource saving, improvement in usability and improvement in durability. These problems are not limited in the semiconductor device having the p-type semiconductor layer and the n-type semiconductor layer mainly made of gallium nitride (GaN) but is commonly found in any semiconductor device having a p-type semiconductor layer and an n-type semiconductor layer made of another material, for example, silicon carbide (SiC).

In order to solve at least part of the problems described above, the invention provides aspects and embodiments described below.

(1) In one aspect of the present invention, there is provided a semiconductor device. The semiconductor device comprises: a p-type semiconductor layer; an n-type semiconductor layer connected with the p-type semiconductor layer; a first electrode layer formed on the n-type semiconductor layer; and a second electrode layer formed on the p-type semiconductor layer. The first electrode layer and the second electrode layer are electrically connected such as to each operate at an identical potential. The second electrode layer is connected with at least a part of a surface of the first electrode layer which is opposite to a surface of the first electrode layer that is in contact with the n-type semiconductor layer. In the semiconductor device of this aspect, the second electrode layer is connected with at least a part of the surface of the first electrode layer which is opposite to the surface of the first electrode layer that is in contact with the n-type semiconductor layer. The first electrode layer and the second electrode layer are accordingly formed to be laid one upon the other, so that the semiconductor device of this aspect does not need an alignment margin and thereby enables miniaturization of the electrode peripheral part. As a result, this enables downsizing of the semiconductor device and reduces the manufacturing cost of the semiconductor device. Additionally, in the semiconductor device of this aspect, the second electrode layer is connected with at least a part of the surface of the first electrode layer which is opposite to the surface of the first electrode layer that is in contact with the n-type semiconductor layer. This configuration improves the flexibility in selection of the material for formation of the first electrode layer.

(2) In the semiconductor device according to above described aspect, the semiconductor device may further comprise: a control electrode layer formed at such a position as to be opposed to a position where the second electrode layer is formed on the p-type semiconductor layer, across the n-type semiconductor layer, and the second electrode layer may be connected with a connection line which is a part of a peripheral line of a joint interface between the p-type semiconductor layer and the n-type semiconductor layer on an interface side between the second electrode layer and the p-type semiconductor layer, and may be formed to be extended on a surface of the n-type semiconductor layer to a position on a control electrode layer side of the connection line. In the semiconductor device of this aspect, the second electrode layer is formed to be extended on the surface of the n-type semiconductor layer to a specific position on the control electrode layer side of the connection line. This configuration enables a hole formed in a neighborhood of the control electrode layer under application of a high voltage to be effectively pulled out by the second electrode layer, thus improving the pressure resistance.

(3) In the semiconductor device according to above described aspects, a distance from the connection line to a control electrode layer-side end of the second electrode layer on a surface of the second electrode layer that is in contact with the n-type semiconductor layer may be equal to or greater than a layer thickness of the n-type semiconductor layer. The semiconductor device of this aspect enables a hole to be effectively pulled out by the second electrode layer without being interfered with by the n-type semiconductor layer, thus effectively improving the pressure resistance.

(4) In the semiconductor device according to above described aspects, a distance from the connection line to a control electrode layer-side end of the second electrode layer on a surface of the second electrode layer that is in contact with the n-type semiconductor layer may be equal to or greater than 0.5 µm but is equal to or less than 20 µm. The semiconductor device of this aspect enables the surface of the n-type semiconductor layer to be consistently covered with the second electrode layer even in taking into consideration the alignment accuracy of a mask used for processing for formation of the electrode layer, while enabling miniaturization of the electrode peripheral part, thus more effectively improving the pressure resistance.

(5) In the semiconductor device according to above described aspects, the first electrode layer may be connected with a connection line which is a part of a peripheral line of a joint interface between the p-type semiconductor layer and the n-type semiconductor layer on an interface side between the second electrode layer and the p-type semiconductor layer and with a surface of the p-type semiconductor layer. In the semiconductor device of this aspect, the first electrode layer is connected with the connection line of the joint interface between the p-type semiconductor layer and the n-type semiconductor layer and with the surface of the p-type semiconductor layer. This configuration does not reduced the contact area between the first electrode layer and the n-type semiconductor layer by the presence of the second electrode layer and thereby does not increase the contact resistance, even on the assumption of a manufacturing positional deviation of the second electrode layer. This accordingly suppresses degradation of the performance of the semiconductor device.

(6) In the semiconductor device according to above described aspects, the second electrode layer may be formed to cover an entire surface of the first electrode layer other than a portion covered with the p-type semiconductor layer and the n-type semiconductor layer. As long as the second electrode layer is made of a material having process tolerance, the semiconductor device of this aspect enables the etching process after formation of the electrode layer to be performed without causing adverse effect on the first electrode layer, even when the first electrode layer is made of a material without process tolerance. This configuration enhances the flexibility in selection of the material for the first electrode layer.

(7) In the semiconductor device according to above described aspects, the semiconductor device may further comprise: an inter-layer insulator film formed to cover the semiconductor layer and the electrode layer and have a contact hole that connects with a surface of the second electrode layer; and a wiring electrode layer formed in the contact hole to be connected with the second electrode layer, and the second electrode layer may be formed to cover a surface of the first electrode layer such that the first electrode layer is isolated from the contact hole. As long as the second electrode layer is made of a material having process tolerance, the semiconductor device of this aspect enables the etching process for formation of the contact hole in the inter-layer insulator film after formation of the electrode layer to be performed without causing adverse effect on the first electrode layer, even when the first electrode layer is made of a material without process tolerance. This configuration enhances the flexibility in selection of the material for the first electrode layer.

(8) In the semiconductor device according to above described aspects, the p-type semiconductor layer and the n-type semiconductor layer may be formed to have a recess having an inner surface defined by the p-type semiconductor layer and the n-type semiconductor layer, and the first electrode layer may be formed to cover at least a part of a surface of the n-type semiconductor layer, which defines the inner surface of the recess. The semiconductor device of this aspect ensures the wide contact area between the first electrode layer and the n-type semiconductor layer. This configuration improves the performance of the semiconductor device.

(9) In the semiconductor device according to above described aspects, the second electrode layer may be formed to cover a part of a surface of the first electrode layer other than a portion covered with the p-type semiconductor layer and the n-type semiconductor layer. The semiconductor device of this aspect omits formation of an unnecessary portion of the electrode layer and thereby reduces the used amount of the electrode material.

(10) In the semiconductor device according to above described aspects, the p-type semiconductor layer and the n-type semiconductor layer may be mainly made of gallium nitride (GaN). The semiconductor device of this aspect includes the p-type semiconductor layer and the n-type semiconductor layer which are mainly made of gallium nitride (GaN). This configuration enables downsizing of the semiconductor device by miniaturization of the electrode peripheral part and improves the flexibility in selection of the material for formation of the first electrode layer.

(11) In the semiconductor device according to above described aspects, the second electrode layer may include a p contact formation layer arranged on a side to be connected with the p-type semiconductor layer, and the p contact formation layer may contain at least one metal selected from the group consisting of nickel (Ni), palladium (Pd) and platinum (Pt) or an alloy of the selected metal. The semiconductor device of this aspect ensures the substantially ohmic contact between the second electrode layer and the p-type semiconductor layer.

(12) In the semiconductor device according to above described aspects, the p contact formation layer may have a layer thickness of not less than 3 nm and not greater than 100 µm. The semiconductor device of this aspect ensures the better ohmic contact between the second electrode layer and the p-type semiconductor layer, while avoiding potential problems caused by the excessive layer thickness of the p contact formation layer: for example, the complicated formation process and the increased material cost.

(13) In the semiconductor device according to above described aspects, the second electrode layer may include a p cap layer arranged on a side of the p contact formation layer that is opposite to a side of the p contact formation layer connected with the p-type semiconductor layer, and the p cap layer may contain at least one metal selected from the group consisting of hafnium (Hf), vanadium (V), titanium (Ti), molybdenum (Mo), niobium (Nb), rhodium (Rh), silicon (Si), tantalum (Ta), tungsten (W), zirconium (Zr), iridium (Ir), osmium (Os), rhenium (Re), TiSi, TiN, TiW, TaSi and TaN or an alloy of the selected metal. In the semiconductor device of this aspect, the second electrode layer has the p cap layer having etch resistance. When the contact hole is formed after formation of the inter-layer insulator film on the second electrode layer, this configuration enables a material without etch resistance to be employed as the material of the p contact formation layer and thereby improves the flexibility in selection of the material for the p contact formation layer.

(14) In the semiconductor device according to above described aspects, the p cap layer may have a layer thickness of not less than 3 nm and not greater than 100 µm. The semiconductor device of this aspect further enhances the etch resistance of the p cap layer, while avoiding potential problems caused by the excessive layer thickness of the p cap layer: for example, the complicated formation process and the increased material cost.

(15) In the semiconductor device according to above described aspects, the first electrode layer may include a first n contact formation layer arranged on a side connected with the n-type semiconductor layer, and a second n contact formation layer arranged on a side of the first n contact formation layer that is opposite to the side of the first n contact formation layer connected with the n-type semiconductor layer, and the first n contact layer may contain at least one metal selected from the group consisting of hafnium (Hf), titanium (Ti) and vanadium (V) or an alloy of the selected metal. The semiconductor device of this aspect ensures the substantially ohmic contact between the first electrode layer and the n-type semiconductor layer.

(16) In the semiconductor device according to above described aspects, the first n contact formation layer may have a layer thickness of not less than 3 nm and not greater than 100 nm. The semiconductor device of this aspect ensures the better ohmic contact between the first electrode layer and the n-type semiconductor layer, while avoiding potential problems caused by the excessive layer thickness of the first electrode layer: for example, the occurrence of a failure such as disconnection of the second electrode layer formed on the first electrode layer and the increased material cost.

(17) In the semiconductor device according to above described aspects, the second n contact formation layer may contain aluminum (Al) or an aluminum (Al) alloy. The semiconductor device of this aspect ensures the further better ohmic contact between the first electrode layer and the n-type semiconductor layer.

(18) In the semiconductor device according to above described aspects, the second n contact formation layer may have a layer thickness of not less than 100 nm and not greater than 1000 nm. The semiconductor device of this aspect ensures the further better ohmic contact between the first electrode layer and the n-type semiconductor layer, while avoiding potential problems caused by the excessive layer thickness of the first electrode layer: for example, the occurrence of a failure such as disconnection of the second electrode layer formed on the first electrode layer and the increased material cost.

(19) In the semiconductor device according to above described aspects, the first electrode layer may include an n barrier layer arranged on a side of the second n contact formation layer that is opposite to the side of the second n contact formation layer connected with the first n contact formation layer, and the n barrier layer may contain at least one metal selected from the group consisting of hafnium (Hf), vanadium (V), titanium (Ti), molybdenum (Mo), niobium (Nb), rhodium (Rh), silicon (Si), tantalum (Ta), tungsten (W), zirconium (Zr), iridium (Ir), osmium (Os), rhenium (Re), TiSi, TiN, TiW, TaSi and TaN or an alloy of the selected metal. The semiconductor device of this aspect inhibits the reaction of the first electrode layer with the second electrode layer.

(20) In the semiconductor device according to above described aspects, the n barrier layer may have a layer thickness of not less than 3 nm and not greater than 1000 nm. The semiconductor device of this aspect more effectively inhibits the reaction of the first electrode layer with the second electrode layer, while avoiding potential problems caused by the excessive layer thickness of the first electrode layer: for example, the occurrence of a failure such as disconnection of the second electrode layer formed on the first electrode layer and the increased material cost.

(21) In the semiconductor device according to above described aspects, the second electrode layer may include a p contact formation layer arranged on a side connected with the p-type semiconductor layer, and the n barrier layer and the p contact formation layer may be made of an identical material. The semiconductor device of this aspect enables the p contact formation layer to simultaneously serve as the n barrier layer. This simplifies the process and reduces the material cost.

All the plurality of components included in each of the aspects of the invention described above are not essential. In order to solve part or all of the problems described above or in order to achieve part or all of the advantageous effects described in the specification hereof, part of the plurality of components may be arbitrarily changed, eliminated or replaced with other new components, and part of the limitations may be eliminated. In order to solve part or all of the problems described above or in order to achieve part or all of the advantageous effects described in the specification hereof, part or all of the technical features included in each aspect of the invention described above may be combined with part or all of the technical features included in another aspect of the invention described above to be implemented as another independent aspect of the invention.

The invention may be implemented by any of various aspects other than the semiconductor device: for example, a power converter including the semiconductor device and a manufacturing method of the semiconductor device.

In the semiconductor device of this invention, the first electrode layer and the second electrode layer are formed to be laid one upon the other, so that the semiconductor device of this invention does not need an alignment margin and thereby enables miniaturization of the electrode peripheral part. As a result, this enables downsizing of the semiconductor device and reduces the manufacturing cost of the semiconductor device. Additionally, in the semiconductor device of this invention, the second electrode layer is connected with at least a part of the surface of the first electrode layer which is opposite to the surface of the first electrode layer that is in contact with the n-type semiconductor layer. This configuration improves the flexibility in selection of the material for formation of the first electrode layer.

BRIEF DESCRIPTION OF THE DRAWINGS

FIG. 10 is a diagram showing the configuration of an inverter 20 which a semiconductor device is applied to.

DESCRIPTION OF EMBODIMENTS

A. First Embodiment

A-1. Configuration of Semiconductor Device

Figure 1:
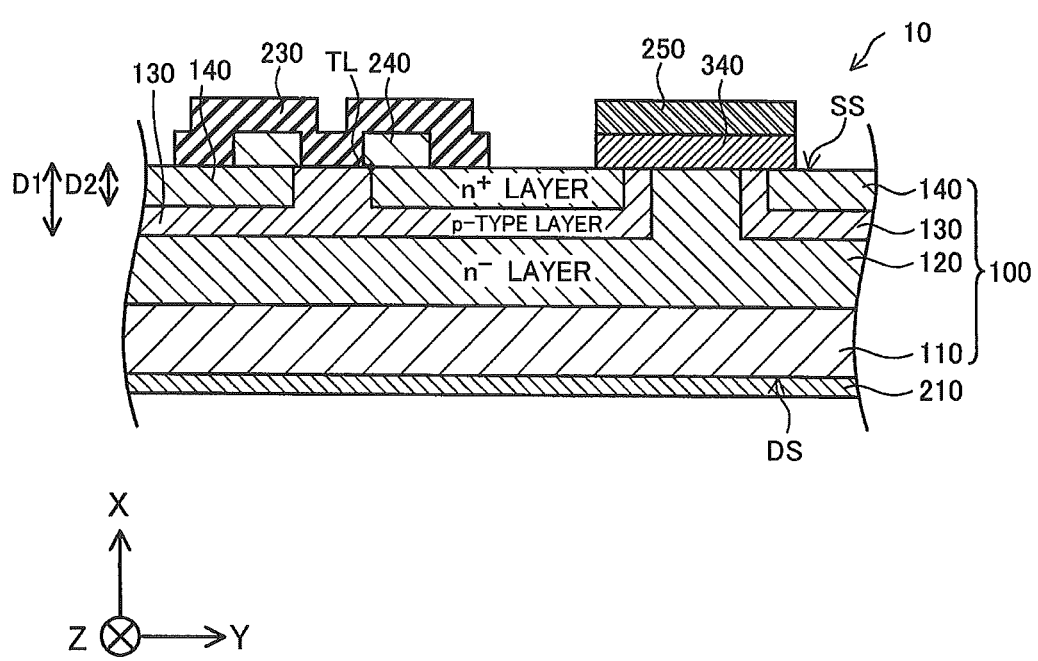
FIG. 1 is a cross sectional view schematically illustrating the configuration of a semiconductor device 10 according to a first embodiment.

FIG. 1 is a cross sectional view schematically illustrating the configuration of a semiconductor device 10 according to a first embodiment. A part of the cross section of the semiconductor device 10 according to this embodiment is illustrated in FIG. 1. FIG. 1 is a diagram that illustrates the technical features of the semiconductor device 10 in an easily comprehensible manner and does not intend to precisely specify the dimensions of the respective parts. In order to facilitate description, X, Y and Z axes orthogonal to one another are shown in FIG. 1. The same applies to the subsequent drawings.

The semiconductor device 10 according to this embodiment is a planar MOSFET and has a layered structure of an n-type substrate 110, a first n-type semiconductor layer 120, a p-type semiconductor layer 130 and a second n-type semiconductor layer 140 stacked in this sequence. Hereinafter the first n-type semiconductor layer 120 is also called "n− (n minus) layer 120;" the p-type semiconductor layer 130 is also called "p-type layer 130;" and the second n-type semiconductor layer 140 is also called "n+ (n plus) layer 140." The direction in which the respective layers are stacked (X-axis direction) is also called the "stacking direction." A layered structure 100 of the n-type substrate 110, the n− layer 120, the p-type layer 130 and the n+ layer 140 has surfaces: the surface defined by the n-type substrate 110 (surface on a −X axis direction side) is also called "drain-side surface DS" and the surface on the opposite side to the drain-side surface DS (surface on a +X axis direction side) is also called "source-side surface SS."

The n-type substrate 110 is in a substantially plate-like shape that is approximately orthogonal to the stacking direction and is mainly made of silicon carbide (SiC). The n− layer 120 is arranged on the surface of one side (+X axis direction side) of the n-type substrate 110. The n− layer 120 is mainly made of silicon carbide (SiC).

The p-type layer 130 is a layer formed by ion implantation into the n− layer 120. More specifically, the p-type layer 130 is formed by implanting a specified ion (dopant) for formation of p-type semiconductor from a partial area of the source-side surface SS of the n− layer 120 (the surface on the opposite side (+X axis direction side) to the n-type substrate 110) at the time before formation of the p-type layer 130 into a predetermined implantation depth (first implantation depth) D1 and subsequently performing heat treatment for activation. Even in the range within the first implantation depth D1 from the source-side surface SS, a portion of the n− layer 120 which is not subjected to ion implantation for formation of the p-type layer 130 remains as the n− layer 120. Upon formation of the p-type layer 130, the surface (interface) of the p-type layer 130 other than the surface defining the source-side surface SS is covered with the n− layer 120.

The n+ layer 140 is a layer formed by ion implantation into a portion of the n− layer 120 where the p-type layer 130 is formed. More specifically, the n+ layer 140 is formed by implanting a specified ion (dopant) for formation of n-type semiconductor from a partial area of the source-side surface SS of the p-type layer 130 at the time after formation of the p-type layer 130 into a predetermined implantation depth (second implantation depth) D2 and subsequently performing heat treatment for activation. Even in the range within the second implantation depth D2 from the source-side surface SS, a portion of the p-type layer 130 which is not subjected to ion implantation for formation of the n+ layer 140 remains as the p-type layer 130. The ion implantation for formation of the n+ layer 140 is performed in an area inside the edge of the source-side surface SS of the p-type layer 130. The second implantation depth D2 is shallower than the first implantation depth D1, so that the surface (interface) of the n+ layer 140 other than the surface defining the source-side surface SS is covered with the p-type layer 130.

The p-type layer 130 and the n+ layer 140 are formed by ion implantation as described above, so that the source-side surface SS of the layered structure 100 of the n-type substrate 110, the n− layer 120, the p-type layer 130 and the n+ layer 140 includes an area formed by the p− layer 120, an area formed by the p-type layer 130 and an area formed by the n+ layer 140. The drain-side surface DS of the layered structure 100 is formed by the n-type substrate 110.

A drain electrode layer 210 is provided on the drain-side surface DS of the n-type substrate 110. The drain electrode layer 210 is made of nickel (Ni).

A p electrode layer 230 is provided on an area of the source-side surface SS of the p-type layer 130 which is adjacent to the n+ layer 140 but is not adjacent to the n− layer 120. The p electrode layer 230 corresponds to the second electrode layer of the claims. The p electrode layer 230 is made of aluminum (Al). The p electrode layer 230 is substantially in ohmic contact with the p-type layer 130.

A source electrode layer 240 is provided on the source-side surface SS of the n+ layer 140. The source electrode layer 240 corresponds to the first electrode layer of the claims. The source electrode layer 240 is made of nickel (Ni). The source electrode layer 240 is substantially in ohmic contact with the n+ layer 140. The detailed configuration of the p electrode layer 230 and the source electrode layer 240 will be described later.

A gate insulator film 340 is formed on an area of the source-side surface SS of the p-type layer 130 which is adjacent to both the n− layer 120 and the n+ layer 140 (i.e., an area of the p-type layer 130 opposed to an area where the p electrode layer 230 is formed, across the n+ layer 140). The gate insulator film 340 is made of silicon dioxide ($SiO_2$). The gate insulator film 340 is provided to continuously cover the above described area of the p-type layer 130, the source-side surface SS of the n− layer 120 adjacent to this area of the p-type layer 130 and a part of the source-side surface SS of the n+ layer 140 adjacent to this area of the p-type layer 130. A gate electrode layer 250 is provided on the surface of the gate insulator film 340 on the opposite side (+X axis direction side) to the p-type layer 130. The gate electrode layer 250 is made of polysilicon. The gate electrode layer 250 is an electrode layer serving to control the electric current in the semiconductor device 10 and is thereby also called control electrode layer.

In the semiconductor device 10 of this configuration, in the state that no voltage is applied to the gate electrode layer 250, the presence of the p-type layer 130 causes the source electrode layer 240 and the drain electrode layer 210 to have no electrical continuity. When a specific or higher voltage is applied to the gate electrode layer 250, on the other hand, an inversion layer is formed in a portion of the p-type layer 130 in the vicinity of the interface between the p-type layer 130 and the gate insulator film 340. This inversion layer serves as a channel, so that the source electrode layer 240 and the drain electrode layer 210 have electrical continuity via the n+ layer 140, the inversion layer formed in the p-type layer 130, the n− layer 120 and the n-type substrate 110.

The following describes the configuration of the p electrode layer 230 and the source electrode layer 240 in more detail. As described above, the source electrode layer 240 is formed on the source-side surface SS of the n+ layer 140 in such a shape as to be extended from the source-side surface SS of the n+ layer 140 further to another portion. More specifically, the source electrode layer 240 is provided to continuously cover a part of the source-side surface SS of the n+ layer 140 (i.e., a portion including a connection line TL, which is a part of the peripheral line of the joint interface between the n+ layer 140 and the p-type layer 130 on the interface side between the p electrode layer 230 and the p-type layer 130) and a part of the source-side surface SS of the p-type layer 130. A designed distance from the above described joint interface to the p electrode layer 230 (i.e., designed size of the surface of the p-type layer 130 covered with the source electrode layer 240) is set to a sufficient distance (sufficient size), in order to enable a part of the surface of the p-type layer 130 to be covered with the source electrode layer 240 even on the assumption of a maximum manufacturing positional deviation.

The p electrode layer 230 is, on the other hand, formed on an area of the source-side surface SS of the p-type layer 130 which is adjacent to the n+ layer 140 but is not adjacent to the n− layer 120, but is not formed to cover the entire area. More specifically, the p electrode layer 230 does not cover at least a portion of the above area that includes the above described connection line TL of the joint interface. The p electrode layer 230 is also provided to cover the entire surface of the source electrode layer 240 other than a portion covered with the n+ layer 140 and the p-type layer 130 (i.e., the surface of the source electrode layer 240 on the opposite side to the surface that is in contact with the n+ layer 140 and the surfaces of the source electrode layer 240 approximately orthogonal to the source-side surface SS of the n+ layer 140). Since the p electrode layer 230 covers the surface of the source electrode layer 240 as described above, the p electrode layer 230 and the source electrode layer 240 operate at the same potential (for example, both at the ground potential). In the specification hereof, "same potential" is not limited to a completely identical potential but includes substantially the same potential.

As described above, in the semiconductor device 10 of this embodiment, the p electrode layer 230 is formed to cover the surface of the source electrode layer 240 on the opposite side to the surface of the source electrode layer 240 that is in contact with the n+ layer 140. In other words, the p electrode layer 230 and the source electrode layer 240 are formed to be stacked along the stacking direction. Accordingly, compared with a semiconductor device having a p electrode layer 230 and a source electrode layer 240 formed distant from each other, the semiconductor device 10 of the embodiment does not need an alignment margin and thereby enables miniaturization of the electrode peripheral part. This embodiment thus enables downsizing of the semiconductor device 10 and reduces the manufacturing cost of the semiconductor device 10.

Additionally, in the semiconductor device 10 of the embodiment, the source electrode layer 240 is covered with the p electrode layer 230 with regard to at least a stacked portion where the p electrode layer 230 and the source electrode layer 240 are stacked. This configuration enables the source electrode layer 240 to be made of a material without process tolerance, on the condition that a residual portion of the source electrode layer 240 other than the stacked portion is isolated by another layer from the etching process performed on the semiconductor device 10. In the semiconductor device 10 of this embodiment, this configuration accordingly enhances the flexibility in selection of the material for the source electrode layer 240. In the semiconductor device 10 of this embodiment, the p electrode layer 230 is provided to cover the entire surface of the source electrode layer 240 other than the portion covered with the n+ layer 140 and the p-type layer 130. The source electrode layer 240 can thus be wholly isolated from the process by the presence of the p electrode layer 230 and may accordingly be made of a material without process tolerance.

In the semiconductor device 10 of this embodiment, the source electrode layer 240 is provided to cover: a portion of the source-side surface SS of the n+ layer 140 which defines the above described connection line TL of the joint interface between the p-type layer 130 and the n+ layer 140; and a part of the surface of the p-type layer 130 adjacent to the connection line TL. In the semiconductor device 10 of the embodiment, this configuration does not reduce the contact area between the source electrode layer 240 and the n+ layer 140 by the presence of the p electrode layer 230 and thereby does not increase the contact resistance, even on the assumption of a manufacturing positional deviation of the p electrode layer 230. Accordingly, this embodiment suppresses degradation of the performance of the semiconductor device 10 (e.g., increase in on-resistance).

A-2. Manufacturing Process of Semiconductor Device

Figure 2:
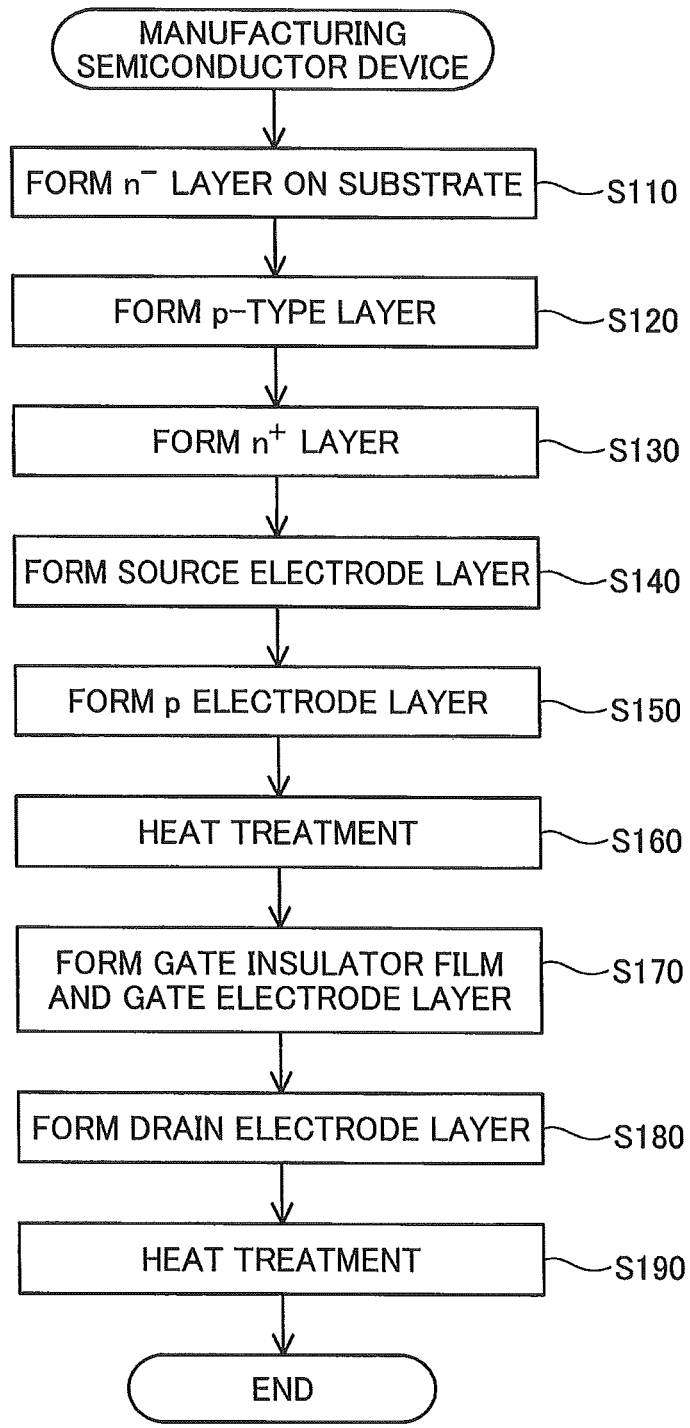
FIG. 2 is a flowchart showing a manufacturing process of the semiconductor device 10 according to the first embodiment.

FIG. 2 is a flowchart showing a manufacturing process of the semiconductor device 10 according to the first embodiment. The manufacturing process first forms the n− layer 120 on the n-type substrate 110 by crystal growth (step S110) and additionally forms the p-type layer 130 and the n+ layer 140 by ion implantation and heat treatment for activation (steps S120 and S130). The manufacturing process then forms the source electrode layer 240 on the n+ layer 140 (step S140) and forms the p electrode layer 230 on the p-type layer 130 (step S150) by electrode material deposition on a resist pattern by photolithography and subsequent lift-off process, and performs heat treatment for reduction of the contact resistance between the respective electrode layers and the respective semiconductor layers (step S160).

Subsequently, the manufacturing process forms the gate insulator film 340 and the gate electrode layer 250 on the p-type layer 130 (step S170), forms the drain electrode layer 210 on the n-type substrate 110 (step S180) and performs heat treatment for reduction of the contact resistance (step S190). The semiconductor device 10 of the embodiment is manufactured by the above process.

A-3. Modifications of First Embodiment

Figure 3:
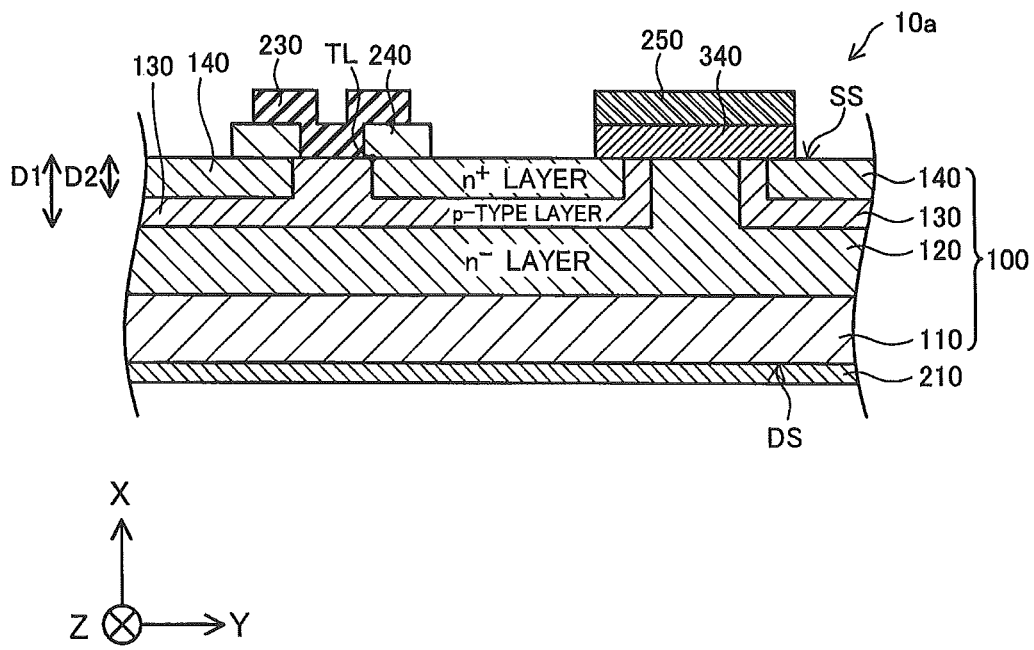
FIG. 3 is a cross sectional view schematically illustrating the configuration of a semiconductor device 10a according to a first modification of the first embodiment.

FIG. 3 is a cross sectional view schematically illustrating the configuration of a semiconductor device 10a according to a first modification of the first embodiment. The semiconductor device 10a according to the first modification of the first embodiment differs in configuration of the p electrode layer 230 from the semiconductor device 10 of the first embodiment illustrated in FIG. 1 but otherwise has the same configuration as that of the semiconductor device 10 of the first embodiment. More specifically, the p electrode layer 230 according to the first modification of the first embodiment is provided to cover only a part of the surface of the source electrode layer 240 on the opposite side to the surface of the source electrode layer 240 that is in contact with the n+ layer 140 and only a part of the surfaces of the source electrode layer 240 approximately orthogonal to the source-side surface SS of the n+ layer 140. The semiconductor device 10a of this modification is expected to be isolated on a −Y direction side of the p electrode layer 230. This modification omits formation of an unnecessary portion of the electrode layer and thereby reduces the used amount of the electrode material.

Figure 4:
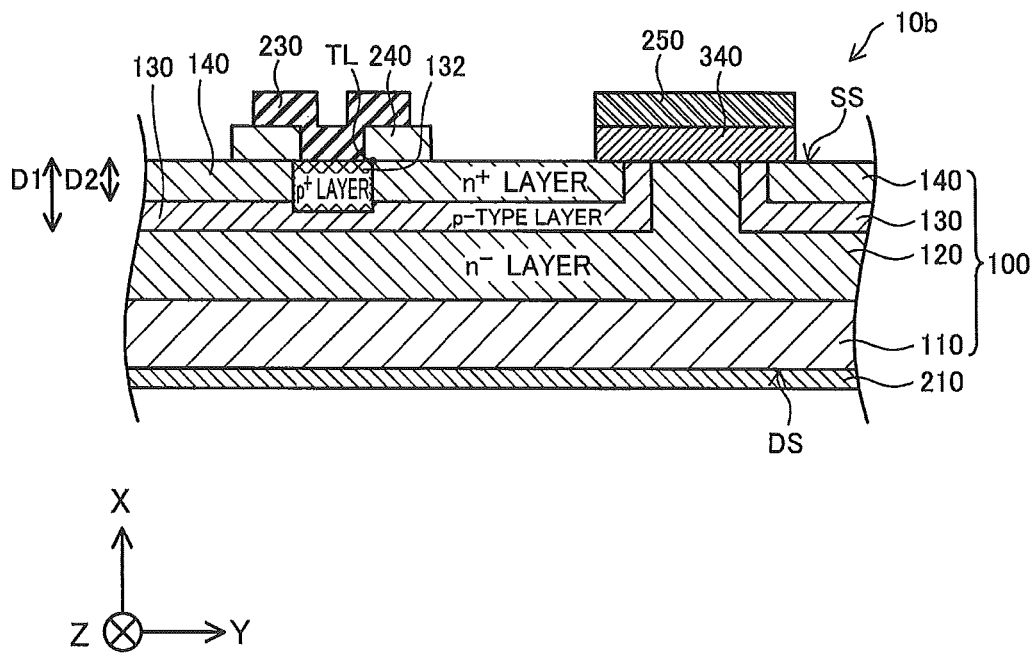
FIG. 4 is a cross sectional view schematically illustrating the configuration of a semiconductor device 10b according to a second modification of the first embodiment.

FIG. 4 is a cross sectional view schematically illustrating the configuration of a semiconductor device 10b according to a second modification of the first embodiment. The semiconductor device 10b according to the second modification of the first embodiment differs in providing a p+ layer 132 from the semiconductor device 10a of the first modification of the first embodiment illustrated in FIG. 3 but otherwise has the same configuration as that of the semiconductor device 10a of the first modification of the first embodiment. More specifically, in the second modification of the first embodiment, after formation of the p-type layer 130 and the n+ layer 140, a p+ layer 132 is formed by implanting a specified ion (dopant) into such a depth that reaches the p-type layer 130 in the area of the p-type layer 130 and the n+ layer 140 and subsequently performing heat treatment for activation. The p electrode layer 230 is formed on the surface (source-side surface SS) of the p+ layer 132. This modification further reduces the contact resistance of the p electrode layer 230.

Figure 5:
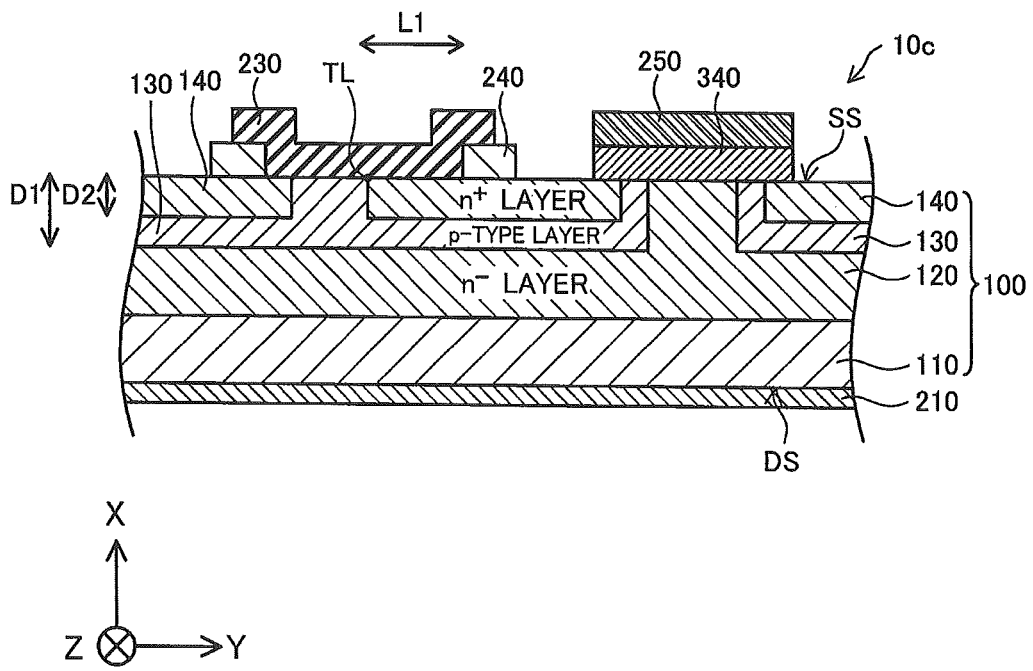
FIG. 5 is a cross sectional view schematically illustrating the configuration of a semiconductor device 10c according to a third modification of the first embodiment.

FIG. 5 is a cross sectional view schematically illustrating the configuration of a semiconductor device 10c according to a third modification of the first embodiment. The semiconductor device 10c according to the third modification of the first embodiment differs in configuration of the source electrode layer 240 and the p electrode layer 230 from the semiconductor device 10a of the first modification of the first embodiment illustrated in FIG. 3 but otherwise has the same configuration as that of the semiconductor device 10a of the first modification of the first embodiment. More specifically, in the third modification of the first embodiment, the p electrode layer 230 is provided to continuously cover the source-side surface SS of the p-type layer 130, a connection line TL which is a part of the peripheral line of the joint interface between the n+ layer 140 and the p-type layer 130 on the interface side between the p electrode layer 230 and the p-type layer 130, and a part of the source-side surface SS of the n+ layer 140. In other words, the p electrode layer 230 is formed to be extended on the surface of the n+ layer 140 to a position on the gate electrode layer 250-side of the connection line TL. According to the third modification of the first embodiment, a distance L1 from the connection line TL to a gate electrode layer 250-side end of the p electrode layer 230 on the surface of the p electrode layer 230 that is in contact with the n+ layer 140 is equal to or greater than the layer thickness of the n+ layer 140 (i.e., second implantation depth D2). The designed value of the distance L1 is set to a sufficient distance (sufficient size), in order to enable the p electrode layer 230 to consistently cover the surface of the n+ layer 140 even in taking into consideration the alignment accuracy of a mask used for processing. The designed value of the distance L1 is set to be not less than 0.5 μm according to the third modification of the first embodiment. The excessive distance L1 interferes with miniaturization of the electrode peripheral part, so that the distance L1 is preferably not greater than 20 μm. The source electrode layer 240, on the other hand, does not cover at least a portion of the source-side surface SS of the n+ layer 140, which forms the joint interface between the p-type layer 130 and the n+ layer 140 (this portion is covered with the p electrode layer 230).

As described above, in the semiconductor device 10c according to the third modification of the first embodiment, the p electrode layer 230 is formed to be extended on the surface of the n+ layer 140 to a position on the gate electrode layer 250-side of the connection line TL. Accordingly, the semiconductor device 10c improves the pressure resistance, compared with a semiconductor device having the p electrode layer 230 that is not extended to a position on the gate electrode layer 250-side of the connection line TL. In the semiconductor device 10c, with an increase in drain voltage, a high electrical field region is created on the drain side of a channel, and high energy electrons cause avalanche multiplication to form a hole of the high concentration. This results in an abrupt increase in drain current in a saturated region of drain current-drain voltage. In the semiconductor device 10c, the p electrode layer 230 which externally pulls out a hole is formed to be extended to a position on the gate electrode layer 250-side of the connection line TL. This configuration enables a hole formed in the vicinity of the gate electrode layer 250 under application of a high voltage to be effectively pulled out by the p electrode layer 230 and suppresses the occurrence of a secondary failure accompanied with avalanche multiplication. The semiconductor device 10c according to the third modification of the first embodiment accordingly improves the pressure resistance. In the semiconductor device 10c according to the third modification of the first embodiment, the distance L1 from the above connection line TL to the gate electrode layer 250-side end of the p electrode layer 230 on the surface of the p electrode layer 230 that is in contact with the n+ layer 140 is controlled to be equal to or greater than the layer thickness of the n+ layer 140. This configuration enables a hole to be effectively pulled out by the p electrode layer 230 without being interfered with by the n+ layer 140, thus effectively improving the pressure resistance.

B. Second Embodiment

B-1. Configuration of Semiconductor Device

Figure 6:
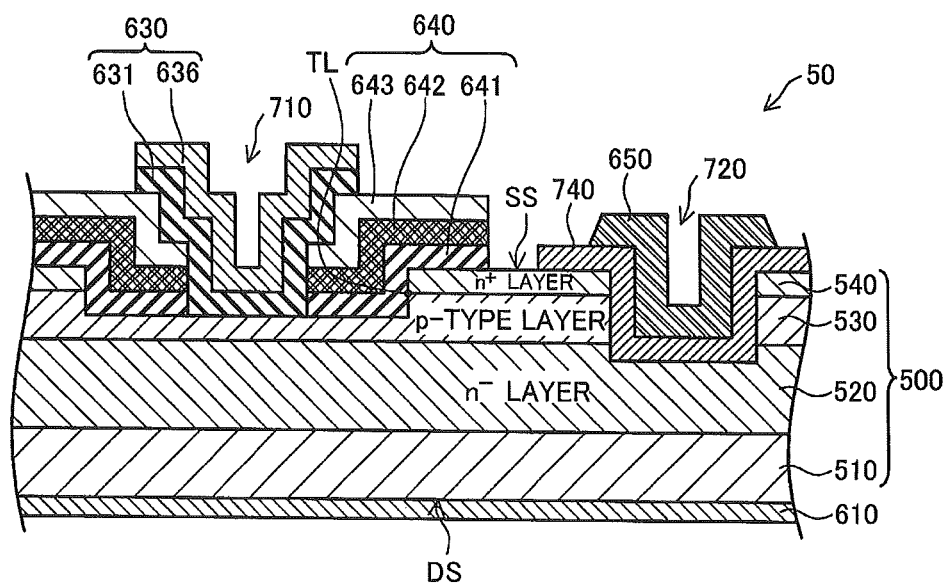
FIG. 6 is a cross sectional view schematically illustrating the configuration of a semiconductor device 50 according to a second embodiment.

FIG. 6 is a cross sectional view schematically illustrating the configuration of a semiconductor device 50 according to a second embodiment. A part of the cross section of the semiconductor device 50 according to this embodiment is illustrated in FIG. 6. The semiconductor device 50 according to the second embodiment is a trench MOSFET and has a layered structure of an n-type substrate 510, a first n-type semiconductor layer 520, a p-type semiconductor layer 530 and a second n-type semiconductor layer 540 stacked in this sequence. Hereinafter the first n-type semiconductor layer 520 is also called "n− (n minus) layer 520;" the p-type semiconductor layer 530 is also called "p-type layer 530;" and the second n-type semiconductor layer 540 is also called "n+ (n plus) layer 540." The direction in which the respective layers are stacked (X-axis direction) is also called the "stacking direction." A layered structure 500 of the n-type substrate 510, the n− layer 520, the p-type layer 530 and the n+ layer 540 has surfaces: the surface defined by the n-type substrate 510 (surface on a −X axis direction side) is also called "drain-side surface DS" and the surface on the opposite side to the drain-side surface DS (surface on a +X axis direction side) is also called "source-side surface SS."

The n-type substrate 510 is in a substantially plate-like shape that is approximately orthogonal to the stacking direction and is mainly made of gallium nitride (GaN). The n− layer 520 is arranged on the surface of one side (+X axis direction side) of the n-type substrate 510. The n− layer 520 is mainly made of gallium nitride (GaN).

The p-type layer 530 is a layer formed by crystal growth and is arranged on the surface of one side (+X axis direction side) of the n− layer 520.

The n+ layer 540 is a layer formed by crystal growth and is arranged on the surface of one side (+X axis direction side) of the p-type layer 530.

A drain electrode layer 610 is provided in the drain-side surface DS of the n-type substrate 510. The drain electrode layer 610 has a layered structure of an aluminum (Al) layer stacked on a titanium (Ti) layer (wherein the titanium layer is arranged on the n-type substrate 510 side).

A trench 720 and a recess 710 are formed on the source-side surface SS of the layered structure 500. The trench 720 is a concavity extended from the source-side surface SS into the n− layer 520. Accordingly, the inner surface of the trench 720 is defined by the n− layer 520, the p-type layer 530 and the n+ layer 540. The recess 710 is a concavity extended from the source-side surface SS into the p-type layer 530. Accordingly, the inner surface of the recess 710 is defined by the p-type layer 530 and the n+ layer 540. The cross sectional shapes of the trench 720 and the recess 710 may be set arbitrarily: for example, a rectangular shape having side faces that are parallel to the stacking direction as shown in FIG. 6; a trapezoidal shape or a wedge shape having side faces that are not parallel to the stacking direction; a partially circular shape or a partially elliptical shape; or a rectangular shape, a trapezoidal shape or a wedge shape having curved corners. The bottom face shapes of the trench 720 and the recess 710 may be set arbitrarily: for example, a rectangular shape, a polygonal shape, a circular shape or an elliptical shape.

A p electrode layer 630 is provided on a portion of the inner surface of the recess 710 defined by the p-type layer 530. The p electrode layer 630 corresponds to the second electrode layer of the claims. The p electrode layer 630 has a two-layer structure of a p contact formation layer 631 that is in contact with the p-type layer 530 and a p cap layer 636 that is formed on the p contact formation layer 631. The p contact formation layer 631 is made of palladium (Pd), and the p cap layer 636 is made of molybdenum (Mo). The layer thickness of the p contact formation layer 631 is preferably not less than 3 nm and not greater than 100 µm. Controlling the layer thickness of the p contact formation layer 631 to this range maintains the substantially ohmic contact between the p electrode layer 630 and the p-type layer 530, while avoiding potential problems caused by the excessive layer thickness of the p contact formation layer 631: for example, the complicated formation process and the increased material cost. The layer thickness of the p contact formation layer 631 is more preferably not less than 5 nm and not greater than 50 µm. Controlling the layer thickness of the p contact formation layer 631 to this range maintains the better ohmic contact between the p electrode layer 630 and the p-type layer 530, while further restricting the layer thickness of the p contact formation layer 631 and more effectively avoiding the above problems. The layer thickness of the p contact formation layer 631 is furthermore preferably not less than 5 nm and not greater than 10 µm. Controlling the layer thickness of the p contact formation layer 631 to this range furthermore restricts the layer thickness of the p contact formation layer 631 and furthermore effectively avoids the above problems. The layer thickness of the p cap layer 636 is preferably not less than 3 nm and not greater than 100 µm. Controlling the layer thickness of the p cap layer 636 to this range ensures the sufficient etch resistance of the p cap layer 636 and thereby enables a material without etch resistance to be employed as the material of the p contact formation layer 631 when a contact hole is formed after formation of an inter-layer insulator film on the p electrode layer 630. This enhances the flexibility in selection of the material for the p contact formation layer 631, while avoiding potential problems caused by the excessive layer thickness of the p cap layer 636: for example, the complicated formation process and the increased material cost. The layer thickness of the p cap layer 636 is more preferably not less than 5 nm and not greater than 50 µm. Controlling the layer thickness of the p cap layer 636 to this range further enhances the etch resistance of the p cap layer 636, while further restricting the layer thickness of the p cap layer 636 and more effectively avoiding the above problems. The layer thickness of the p cap layer 636 is furthermore preferably not less than 5 nm and not greater than 10 µm. Controlling the layer thickness of the p cap layer 636 to this range furthermore restricts the layer thickness of the p cap layer 636 and furthermore effectively avoids the above problems.

A source electrode layer 640 is provided on the source-side surface SS of the n+ layer 540. The source electrode layer 640 corresponds to the first electrode layer of the claims. The source electrode layer 640 has a three-layer structure of a first n contact formation layer 641 that is in contact with the n+ layer 540, a second n contact formation layer 642 that is formed on the first n contact formation layer 641 and an n barrier layer 643 that is formed on the second n contact formation layer 642. The first n contact formation layer 641 is made of vanadium (V), the second n contact formation layer 642 is made of aluminum (Al) and the n barrier layer 643 is made of molybdenum (Mo). The layer thickness of the first n contact formation layer 641 is preferably not less than 3 nm and not greater than 100 nm. Controlling the layer thickness of the first n contact formation layer 641 to this range maintains the substantially ohmic contact between the source electrode layer 640 and the n+ layer 540, while preventing the excessive layer thickness of the source electrode layer 640. The excessive layer thickness of the source electrode layer 640 is undesired since it may cause problems: for example, the occurrence of a failure such as disconnection of the p electrode layer 630 formed on the source electrode layer 640; a difficulty in embedding the p electrode layer 630 when the source electrode layer 640 and the p electrode layer 630 are to be embedded in the miniaturized recess 710; and the increased material cost. The layer thickness of the first n contact formation layer 641 is more preferably not less than 5 nm and not greater than 50 nm. Controlling the layer thickness of the first n contact formation layer 641 to this range maintains the better ohmic contact between the source electrode layer 640 and the n+ layer 540, while further restricting the layer thickness of the source electrode layer 640 and more effectively avoiding the above problems. The layer thickness of the second n contact formation layer 642 is preferably not less than 100 nm and not greater than 1000 nm. Controlling the layer thickness of the second n contact formation layer 642 maintains the better ohmic contact between the source electrode layer 640 and the n+ layer 540, while avoiding potential problems caused by the excessive layer thickness of the second n contact formation layer 642: for example, the complicated formation process and the increased material cost. The layer thickness of the second n contact formation layer 642 is more preferably not less than 200 nm and not greater than 500 nm. Controlling the layer thickness of the second n contact formation layer 642 maintains the further better ohmic contact between the source electrode layer 640 and the n+ layer 540, while further restricting the layer thickness of the second n contact formation layer 642 and more effectively avoiding the above problems. The layer thickness of the n barrier layer 643 is preferably not less than 3 nm and not greater than 1000 nm. Controlling the layer thickness of the n barrier layer 643 to this range inhibits the reaction of the source electrode layer 640 with the p electrode layer 630, while preventing the excessive layer thickness of the source electrode layer 640. The layer thickness of the n barrier layer 643 is more preferably not less than 5 nm and not greater than 500 nm. Controlling the layer thickness of the n barrier layer 643 to this range more effectively inhibits the reaction of the source electrode layer 640 with the p electrode layer 630, while further restricting the layer thickness of the source electrode layer 640 and more effectively avoiding the above problems. The detailed structures of the p electrode layer 630 and the source electrode layer 640 will be described later.

A gate insulator film 740 is formed on the inner surface of the trench 720. The gate insulator film 740 is made of silicon dioxide ($SiO_2$). The gate insulator film 740 is provided to continuously cover the entire inner surface of the trench 720 and a part of the source-side surface SS of the n+ layer 540 adjacent to the trench 720. A gate electrode layer 650 is provided on the surface of the gate insulator film 740 on the opposite side to the surface of the gate insulator film 740 that is in contact with the semiconductor layers. The gate electrode layer 650 is made of aluminum (Al). The gate electrode layer 650 is an electrode layer serving to control the electric current in the semiconductor device 50 and is thereby also called control electrode layer.

In the semiconductor device 50 of this configuration, in the state that no voltage is applied to the gate electrode layer 650, the presence of the p-type layer 530 causes the source electrode layer 640 and the drain electrode layer 610 to have no electrical continuity. When a specific or higher voltage is applied to the gate electrode layer 650, on the other hand, an inversion layer is formed in a portion of the p-type layer 530 in the vicinity of the interface between the p-type layer 530 and the gate insulator film 740. This inversion layer serves as a channel, so that the source electrode layer 640 and the drain electrode layer 610 have electrical continuity via the n+ layer 540, the inversion layer formed in the p-type layer 530, the n− layer 520 and the n-type substrate 510.

The following describes the configuration of the p electrode layer 630 and the source electrode layer 640 in more detail. As described above, the source electrode layer 640 is formed on the source-side surface SS of the n+ layer 540 in such a shape as to be extended from the source-side surface SS of the n+ layer 540 to another portion. More specifically, the source electrode layer 640 is provided to continuously cover a part of the source-side surface SS of the n+ layer 540 and a part of the inner surface of the recess 710 (i.e., a portion including the surface of the n+ layer 540 and the surface of the p-type layer 530 across a connection line TL, which is a part of the peripheral line of the joint interface between the n+ layer 540 and the p-type layer 530 on the interface side between the p electrode layer 630 and the p-type layer 530).

The p electrode layer 630 is, on the other hand, formed on the inner surface of the recess 710 but is not formed to cover the entire inner surface of the recess 710. More specifically, the p electrode layer 630 is provided to cover only a part of a portion of the inner surface of the recess 710 defined by the p-type layer 530. The p electrode layer 630 is also provided to cover a part of the surface of the source electrode layer 640 other than a portion covered with the n+ layer 540 and the p-type layer 530 (i.e., the surface of the source electrode layer 640 on the opposite side to the surface that is in contact with the n+ layer 540 and the surfaces of the source electrode layer 640 approximately orthogonal to the source-side surface SS of the n+ layer 540). Since the p electrode layer 630 covers the surface of the source electrode layer 640 as described above, the p electrode layer 630 and the source electrode layer 640 operate at the same potential (for example, both at the ground potential).

As described above, in the semiconductor device 50 of this embodiment, the p electrode layer 630 is formed to cover the surface of the source electrode layer 640 on the opposite side to the surface of the source electrode layer 640 that is in contact with the n+ layer 540. In other words, the p electrode layer 630 and the source electrode layer 640 are formed to be stacked along the stacking direction. Accordingly, compared with a semiconductor device having a p electrode layer 630 and a source electrode layer 640 formed distant from each other, the semiconductor device 50 of the embodiment does not need an alignment margin and thereby enables miniaturization of the electrode peripheral part. This embodiment thus enables downsizing of the semiconductor device 50 and reduces the manufacturing cost of the semiconductor device 50.

Additionally, in the semiconductor device 50 of the embodiment, the source electrode layer 640 is covered with the p electrode layer 630 with regard to at least a stacked portion where the p electrode layer 630 and the source electrode layer 640 are stacked. This configuration enables the source electrode layer 640 to be made of a material without process tolerance, on the condition that a residual portion of the source electrode layer 640 other than the stacked portion is isolated by another layer from the etching process performed on the semiconductor device 50. In the semiconductor device 50 of this embodiment, this configuration accordingly enhances the flexibility in selection of the material for the source electrode layer 640.

In the semiconductor device 50 of this embodiment, the source electrode layer 640 is provided to continuously cover a portion of the inner surface of the recess 710 including the above connection line TL and a part of the surface of the p-type layer 530 adjacent to the joint interface. In the semiconductor device 50 of the embodiment, the source electrode layer 640 is accordingly in contact with a portion of the surface of the n+ layer 540 which forms the inner surface of the recess 710, in addition to a portion of the surface of the n+ layer 540 which forms the source-side surface SS. In the semiconductor device 50 of the embodiment, this configuration increases the contact area between the source electrode layer 640 and the n+ layer 540 and improves the performance of the semiconductor device 50 (decreases the on-resistance). Additionally, in the semiconductor device 50 of the embodiment, this configuration does not reduce the contact area between the source electrode layer 640 and the n+ layer 540 by the presence of the p electrode layer 630 and thereby does not increase the contact resistance, even on the assumption of a manufacturing positional deviation of the p electrode layer 630. Accordingly, this embodiment suppresses degradation of the performance of the semiconductor device 50 (e.g., increase in on-resistance).

In the semiconductor device 50 of this embodiment, the source electrode layer 640 is provided to cover only a part of the surface of the p electrode layer 630 on the opposite side to the surface of the p electrode layer 630 that is in contact with the p-type layer 530 and only a part of the surfaces of the p electrode layer 630 approximately orthogonal to the source-side surface SS of the p-type layer 530. The semiconductor device 50 of this embodiment is expected to be isolated on a −Y direction side of the p electrode layer 630. The semiconductor device 50 of the embodiment omits formation of an unnecessary portion of the electrode layer and thereby reduces the used amount of the electrode material.

B-2. Manufacturing Process of Semiconductor Device

Figure 7:
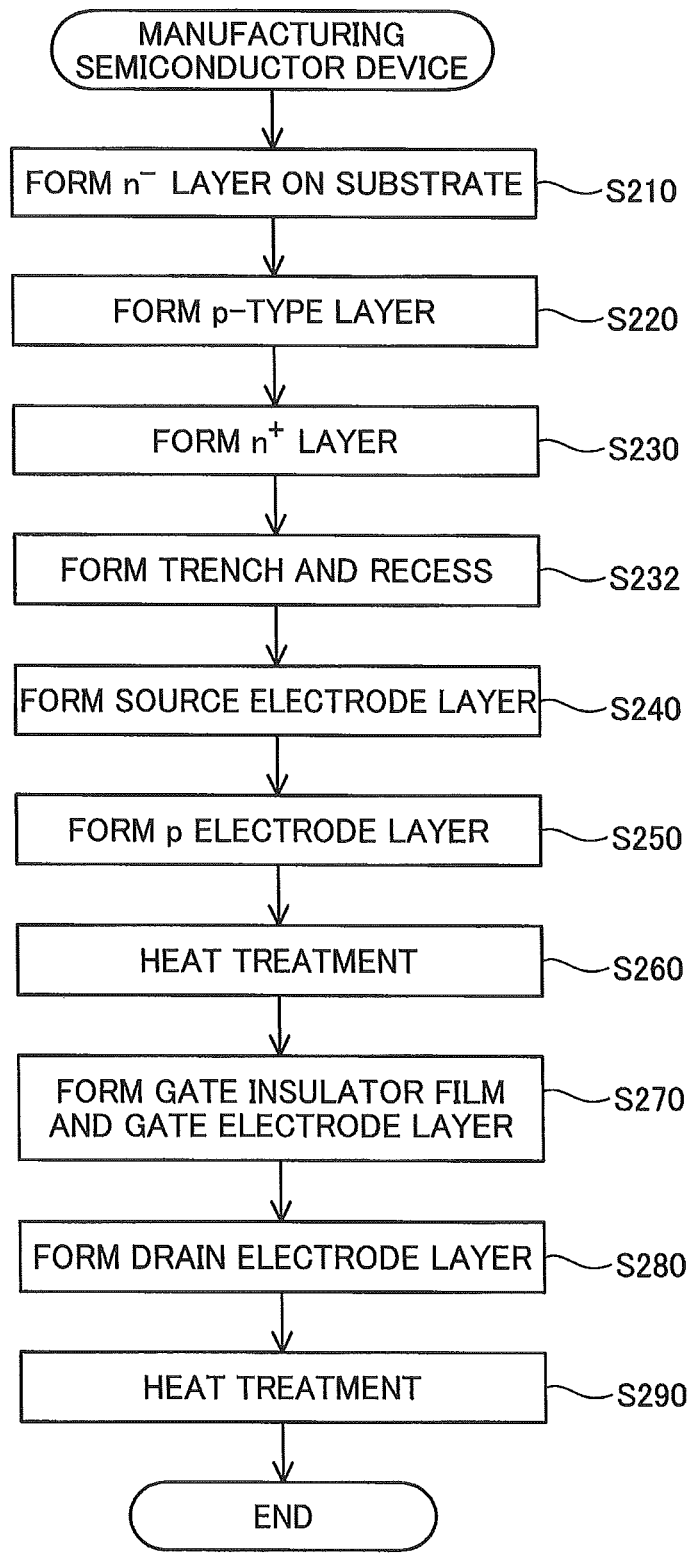
FIG. 7 is a flowchart showing a manufacturing process of the semiconductor device 50 according to the second embodiment.

FIG. 7 is a flowchart showing a manufacturing process of the semiconductor device 50 according to the second embodiment. The manufacturing process first forms the n− layer 520 on the n-type substrate 510 by crystal growth (step S210) and additionally forms the p-type layer 530 and the n+ layer 540 by crystal growth (steps S220 and S230). The manufacturing process then forms the trench 720 and the recess 710 on the source-side surface SS of the layered structure 500 by dry etching (step S232), forms the source electrode layer 640 on the n+ layer 540 (step S240) and forms the p electrode layer 630 on the p-type layer 530 (step S250) by electrode material deposition on a resist pattern by photolithography and subsequent lift-off process, and performs heat treatment for reduction of the contact resistance between the respective electrode layers and the respective semiconductor layers (step S260).

Subsequently, the manufacturing process forms the gate insulator film 740 and the gate electrode layer 650 on the surface of the trench 720 (step S270), forms the drain electrode layer 610 on the n-type substrate 510 (step S280) and performs heat treatment for reduction of the contact resistance (step S290). The semiconductor device 50 of the embodiment is manufactured by the above process.

B-3. Modifications of Second Embodiment

Figure 8:
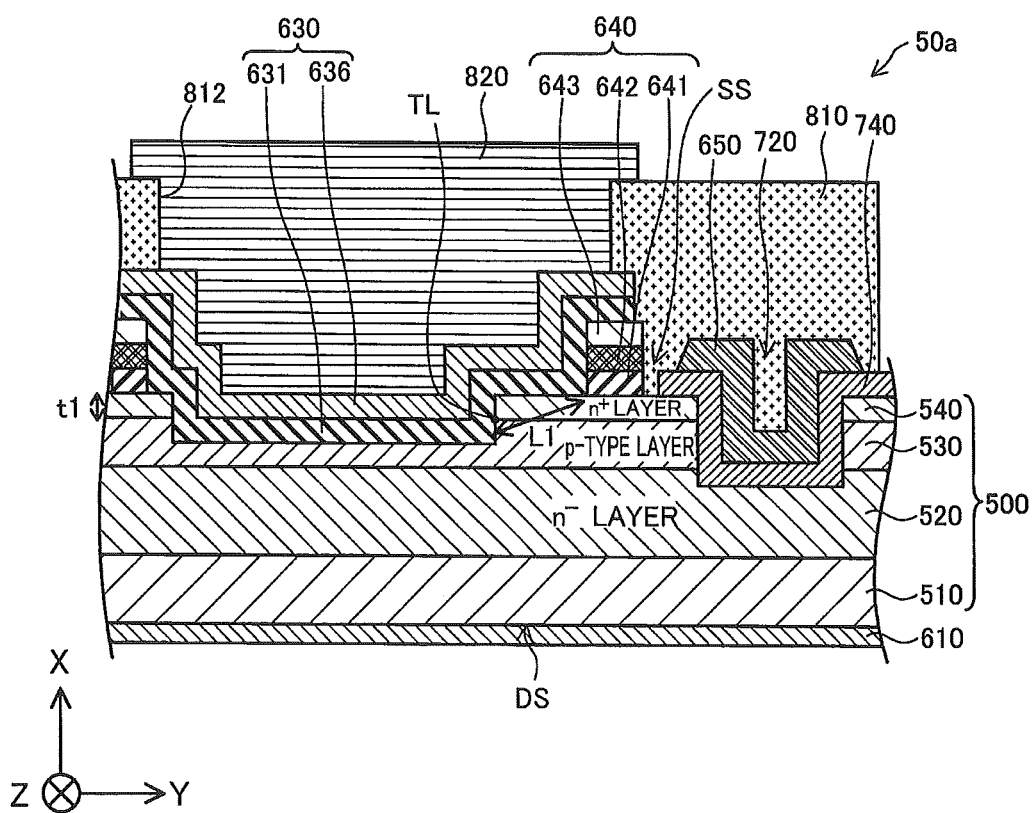
FIG. 8 is a cross sectional view schematically illustrating the configuration of a semiconductor device 50a according to a modification of the second embodiment.

FIG. 8 is a cross sectional view schematically illustrating the configuration of a semiconductor device 50a according to a modification of the second embodiment. The semiconductor device 50a according to the modification of the second embodiment differs in configuration of the source electrode layer 640 and the p electrode layer 630 and in providing an inter-layer insulator film 810 and a wiring electrode layer 820 from the semiconductor device 50 of the second embodiment illustrated in FIG. 6 but otherwise has the same configuration as that of the semiconductor device 50 of the second embodiment.

In the semiconductor device 50a according to the modification of the second embodiment, the p electrode layer 630 is formed on a specific area of the inner surface of the recess 710 that is defined by the p-type layer 530 in such a shape as to be extended from this specific area to another portion. More specifically, the p electrode layer 630 is provided to continuously cover the above specific area of the p-type layer 530, the above connection line TL of the joint interface between the n+ layer 540 and the p-type layer 530, an area of the inner surface of the recess 710 that is defined by the n+ layer 540 and a part of the source-side surface SS of the n+ layer 540. In other words, the p electrode layer 630 is formed to be extended on the surface of the n+ layer 540 to a position on the gate electrode layer 650-side of the connection line TL. According to the modification of the second embodiment, a distance L1 from the connection line TL to a gate electrode layer 650-side end of the p electrode layer 630 on the surface of the p electrode layer 630 that is in contact with the n+ layer 540 is equal to or greater than a layer thickness t1 of the n+ layer 540. The designed value of the distance L1 is set to a sufficient distance (sufficient size), in order to enable the p electrode layer 630 to consistently cover the surface of the n+ layer 540 even in taking into consideration the alignment accuracy of a mask used for processing. The designed value of the distance L1 is set to be not less than 0.5 μm according to the modification of the second embodiment. The excessive distance L1 interferes with miniaturization of the electrode peripheral part, so that the distance L1 is preferably not greater than 20 μm. The source electrode layer 640, on the other hand, does not cover at least a portion of the surface of the n+ layer 540 including the above described connection line TL of the joint interface (this portion is covered with the p electrode layer 630).

In the semiconductor device 50a according to the modification of the second embodiment, an inter-layer insulator film 810 is formed on the layered structure 500 after formation of the respective electrodes. A contact hole 812 is formed in the inter-layer insulator film 810. The contact hole 812 is provided at a position where the p electrode layer 630 and the source electrode layer 640 are formed in the layered structure 500. A wiring electrode layer 820 is formed on the inter-layer insulator film 810. The wiring electrode layer 820 is in contact with the surface of the inter-layer insulator film 810 and the inner surface (side face) of the contact hole 812 and is electrically connected with the p electrode layer 630 via the contact hole 812. The p electrode layer 630 and the source electrode layer 640 operate at the same potential, so that the wiring electrode layer 820 is also electrically connected with the source electrode layer 640. The p electrode layer 630 is provided to cover the surface of the source electrode layer 640, so that the source electrode layer 640 is isolated from the contact hole 812.

Figure 9:
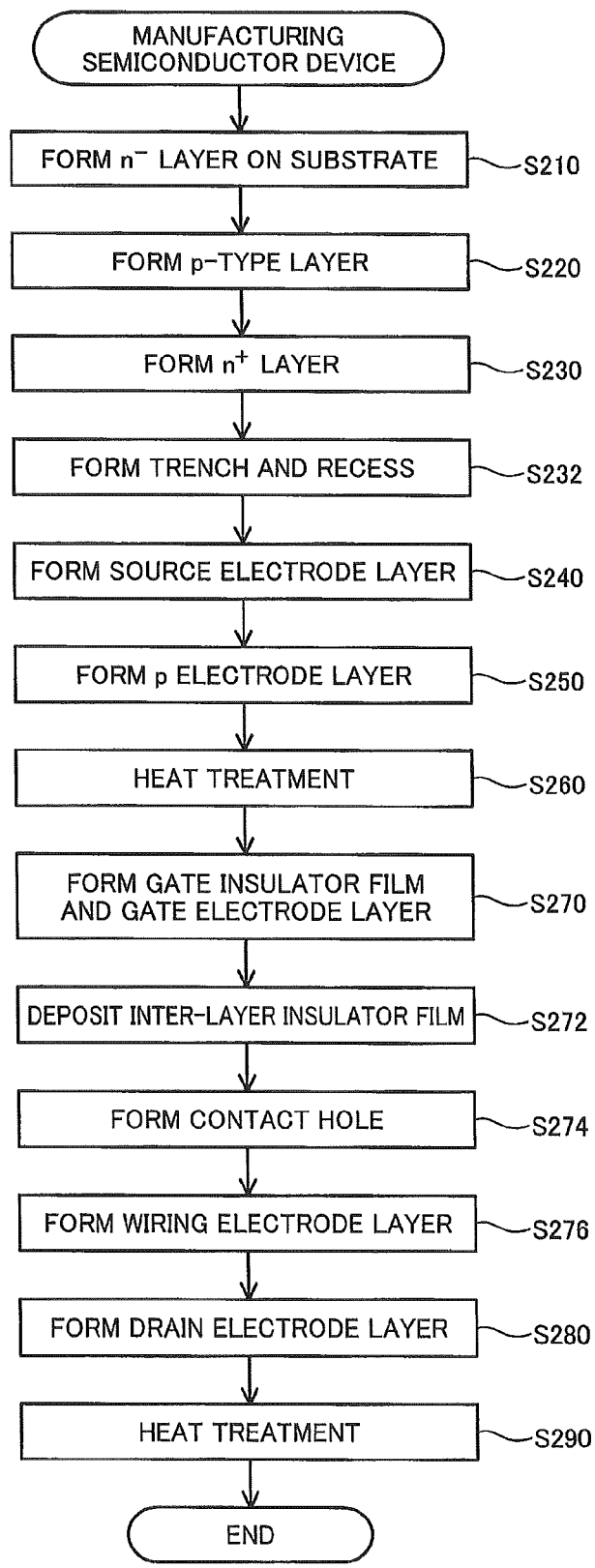
FIG. 9 is a flowchart showing a manufacturing process of the semiconductor device 50a according to the modification of the second embodiment.

FIG. 9 is a flowchart showing a manufacturing process of the semiconductor device 50a according to the modification of the second embodiment. The manufacturing process of the modification is the same as the manufacturing process of the second embodiment shown in FIG. 7 from formation of the n− layer 520 (step S210) to formation of the gate insulator film 740 and the gate electrode layer 650 (step S270). After formation of the gate insulator film 740 and the gate electrode layer 650, the manufacturing process deposits the inter-layer insulator film 810 on the layered structure 500 (step S272) and etches out a part of the inter-layer insulator film 810 to form the contact hole 812 (step S274). The manufacturing process then forms the wiring electrode layer 820 to be connected with the p electrode layer 630 via the contact hole 812 (step S276). Subsequently, in the same manner as the manufacturing process of the second embodiment, the manufacturing process forms the drain electrode layer 610 (step S280) and performs heat treatment for reduction of the contact resistance (step S290). The semiconductor device 50a according to the modification of the second embodiment is manufactured by the above process.

As described above, in the semiconductor device 50a according to the modification of the second embodiment, the p electrode layer 630 is formed to be extended on the surface of the n+ layer 540 to a position on the gate electrode layer 650-side of the connection line TL. Accordingly, the semiconductor device 50a according to the modification of the second embodiment enables a hole formed in the vicinity of the gate electrode layer 650 under application of a high voltage to be effectively pulled out by the p electrode layer 630 and improves the pressure resistance of the semiconductor device 50a. Additionally, in the semiconductor device 50a according to the modification of the second embodiment, the distance L1 from the above described connection line TL to the gate electrode layer 650-side end of the p electrode layer 630 on the surface of the p electrode layer 630 that is in contact with the n+ layer 540 is equal to or greater than the layer thickness t1 of the n+ layer 540. This configuration enables a hole to be effectively pulled out by the p electrode layer 630 without being interfered with by the n+ layer 540, thus effectively improving the pressure resistance.

In the semiconductor device 50a according to the modification of the second embodiment, the p electrode layer 630 is in contact with the p-type layer 530 on side faces of the inner surface of the recess 710 which are defined by the p-type layer 530 and the n+ layer 540 in addition to a bottom face of the inner surface of the recess 710 which is defined by the p-type layer 530. This configuration enables a hole to be more effectively pulled out by the p electrode layer 630 and more effectively improves the pressure resistance.

In the semiconductor device 50a according to the modification of the second embodiment, the p electrode layer 630 is provided to cover the surface of the source electrode layer 640, such that the source electrode layer 640 is isolated from the contact hole 812. As long as the p electrode layer 630 is made of a material having process tolerance, this configuration enables the contact hole 812 to be formed without causing adverse effect on the source electrode layer 640 and enables the wiring electrode layer 820 to be electrically connected with the p electrode layer 630 and the source electrode layer 640 in the etching process for formation of the contact hole 812, even when the source electrode layer 640 is made of a material without the process tolerance. In the semiconductor device 50a according to the modification of the second embodiment, this enhances the flexibility in selection of the material for the source electrode layer 640.

C. Other Modifications

The invention is not limited to the embodiments or their modifications described above but may be implemented by any of various other embodiments without departing from the spirit and scope of the invention. Some examples of possible modifications are described below.

C1. Another Modification 1

The above embodiments respectively describe the planar MOSFET and the trench MOSFET among the semiconductor devices, but the invention is applicable to other different types of semiconductor devices. For example, the invention is applicable to a lateral MOSFET, an insulated gate bipolar transistor (IGBT) and a bipolar transistor (including a base electrode layer serving as a control electrode layer). Furthermore, the invention is applicable to semiconductor devices in general where a first electrode layer formed on an n-type semiconductor layer and a second electrode layer formed on a p-type semiconductor layer operate at the same potential.

Figure 10:
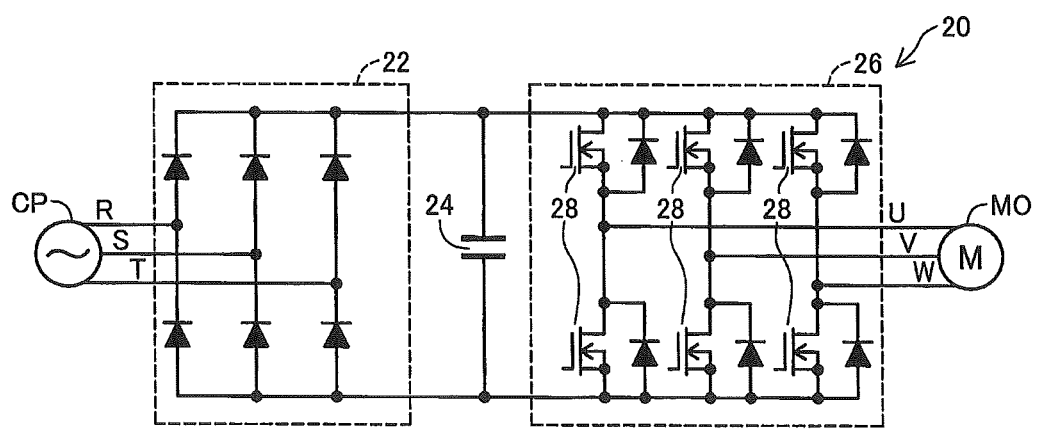

The semiconductor device of the invention is also applicable to an inverter 20 which serves as a power converter as shown in FIG. 10. The inverter 20 shown in FIG. 10 is a circuit configured to convert the frequency of a commercial power source CP and supply the power of the converted frequency to, for example, a motor MO and includes a converter circuit 22, a smoothing capacitor 24 and an inverter circuit 26. The semiconductor device 10 or 50 described above is applicable as switching elements 28 included in the inverter circuit 26. Furthermore, the semiconductor device of the invention is applicable to another power converter, such as a power factor correction circuit.

C2. Another Modification 2

The manufacturing processes described in the above respective embodiments are only illustrative and may be modified in various ways. For example, in the first embodiment described above, the p-type layer 130 and the n+ layer 140 are formed by ion implantation. These layers may, however, be formed by another technique, such as impurity diffusion or selective regrowth. In the respective embodiments described above, heat treatment is performed (step S160 in FIG. 2 or step S260 in FIG. 7) after formation of the p electrode layer 230 or 630 and the source electrode layer 240 or 640. A modified process may, however, perform heat treatment for the p electrode layer 230 or 630 after formation of the p electrode layer 230 or 630 and perform heat treatment for the source electrode layer 240 or 640 after formation of the source electrode layer 240 or 640.

In the above respective embodiments, the p electrode layer 230 or 630 and the source electrode layer 240 or 640 are formed by electrode material deposition on a resist pattern by photolithography and subsequent lift-off process. A modified process may, however, form the p electrode layer 230 or 630 and the source electrode layer 240 or 640 by another technique, for example, a processing method using a resist pattern by photolithography as a mask.

C3. Another Modification 3

The formation materials of the respective semiconductor layers in the above respective embodiments are only illustrative and may be replaced with other materials. For example, in the first embodiment described above, each semiconductor layer is mainly made of silicon carbide (SiC). Alternatively, each semiconductor layer may be made of another material, such as gallium nitride (GaN) or silicon (Si). In the second embodiment described above, each semiconductor layer is mainly made of gallium nitride (GaN). Alternatively, each semiconductor layer may be made of another material, such as silicon carbide (SiC) or silicon (Si).

C4. Another Modification 4

The structures of the respective electrode layers in the above respective embodiments are only illustrative and may be modified in various ways. For example, in the second embodiment, even when the second n contact formation layer 642 of the source electrode layer 640 is made of aluminum (Al) having poor etch resistance, the n barrier layer 643 may be omitted from the source electrode layer 640 as long as the source electrode layer 640 is covered with the p electrode layer 630 and is not exposed to the etching process.

Additionally, the formation materials of the respective electrode layers in the above respective embodiments are only illustrative and may be replaced with other materials according to the number of layers included in each electrode layer and the material of a semiconductor layer which each electrode layer is connected with. For example, in the second embodiment described above, the p contact formation layer 631 may be formed by containing at least one metal selected from the group consisting of nickel (Ni), palladium (Pd) and platinum (Pt) or an alloy of the selected metal. This ensures the substantially ohmic contact between the p electrode layer 630 and the p-type layer 530. In the second embodiment described above, the p cap layer 636 may be formed by containing at least one metal selected from the group consisting of hafnium (Hf), vanadium (V), titanium (Ti), molybdenum (Mo), niobium (Nb), rhodium (Rh), silicon (Si), tantalum (Ta), tungsten (W), zirconium (Zr), iridium (Ir), osmium (Os), rhenium (Re), TiSi, TiN, TiW, TaSi and TaN or an alloy of the selected metal. In this application, the p electrode layer 630 includes the p cap layer 636 having the etch resistance. This enables a material without etch resistance to be employed as the material of the p contact formation layer 631 when a contact hole is formed after formation of an inter-layer insulator film on the p electrode layer 630. This accordingly enhances the flexibility in selection of the material for the p contact formation layer 631.

In the second embodiment described above, the first n contact formation layer 641 may be formed by containing at least one metal selected from the group consisting of hafnium (Hf), titanium (Ti) and vanadium (V) or an alloy of the selected metal. This ensures the substantially ohmic contact between the source electrode layer 640 and the n+ layer 540. In the second embodiment described above, the second n contact formation layer 642 may be formed by containing aluminum (Al) or an aluminum (Al) alloy. This ensures the good ohmic contact between the source electrode layer 640 and the n+ layer 540. In the second embodiment described above, the n barrier layer 643 may be formed by containing at least one metal selected from the group consisting of hafnium (Hf), vanadium (V), titanium (Ti), molybdenum (Mo), niobium (Nb), rhodium (Rh), silicon (Si), tantalum (Ta), tungsten (W), zirconium (Zr), iridium (Ir), osmium (Os), rhenium (Re), TiSi, TiN, TiW, TaSi and TaN or an alloy of the selected metal. This inhibits the reaction of the p electrode layer 630 with the source electrode layer 640.

The first embodiment employs polysilicon and the second embodiment employs aluminum for the gate electrode layer 250 or 650 as the control electrode layer. Alternatively, the first embodiment may employ aluminum and the second embodiment may employ polysilicon. The gate electrode layer 250 or 650 may be made of another material or may be formed in a multi-layered structure. For example, the gate electrode layer 250 or 650 may be formed in a two-layered structure, such as Au/Ni structure, Al/Ti structure, Al/TiN structure (wherein Ni, Ti and TiN are respectively on the gate insulator film side) or may be formed in a three-layered structure, such as TiN/Al/TiN structure.

In the second embodiment described above, the n barrier layer 643 and the p contact formation layer 631 may be made of the same material. This enables the p contact formation layer 631 to simultaneously serve as the n barrier layer 643, thus simplifying the process and reducing the material cost. In one exemplified structure of the p electrode layer 630 and the source electrode layer 640, the first n contact formation layer 641 may be made of titanium (Ti), the second n contact formation layer 642 may be made of aluminum (Al), and a layer made of palladium (Pd) may serve as the n barrier layer 643 and the p contact formation layer 631 (p electrode layer 630).

C5. Another Modification 5

In the above respective embodiments, the gate insulator film 340 or 740 is made of silicon dioxide ($SiO_2$). The gate insulator film 340 or 740 may, however, be made of another material, such as aluminum oxide ($Al_2O_3$), silicon nitride (SiN), hafnium oxide ($HfO_2$) or zirconium oxide ($ZrO_2$). Moreover, the gate insulator film 340 or 740 may be formed in a multi-layered structure. For example, the gate insulator film 340 or 740 may be formed in a two-layered structure, such as $ZrO_2/SiO_2$ structure wherein $ZrO_2$ is provided on $SiO_2$, $HfO_2/SiO_2$ structure, $Al_2O_3/SiO_2$ structure or $SiO_2/$SiN structure or may be formed in a three-layered structure, such as $ZrO_2/SiO_2/$SiN structure wherein $SiO_2$ is provided on SiN and $ZrO_2$ is further provided on $SiO_2$ or $HfO_2/Al_2O_3/SiO_2$ structure.

The invention is not limited to the embodiments or the modifications described above but may be implemented by any of various other aspects or configurations without departing from the spirit and scope of the invention. For example, the technical features of each of the embodiments and the modifications corresponding to the technical features of each aspect described in SUMMARY OF THE INVENTION may be replaced or combined arbitrarily, in order to solve part or all of the problems described above or in order to achieve part of all of the advantageous effects described above. The technical features that are not described as essential in the specification hereof may be eliminated arbitrarily.

The invention claimed is:

1. A semiconductor device, comprising:
    a p-type semiconductor layer;
    an n-type semiconductor layer connected with the p-type semiconductor layer;
    a first electrode layer formed on the n-type semiconductor layer; and
    a second electrode layer formed on the p-type semiconductor layer,
    wherein the first electrode layer and the second electrode layer are electrically connected such as to each operate at an identical potential, and
    wherein the second electrode layer is disposed on at least a part of a top surface of the first electrode layer which is opposite to a bottom surface of the first electrode layer, the bottom surface of the first electrode layer being disposed on a surface of the n-type semiconductor layer.

2. The semiconductor device according to claim 1, further comprising:
    a control electrode layer formed at such a position as to be opposed to a position where the second electrode layer is formed on the p-type semiconductor layer, across the n-type semiconductor layer,
    wherein the second electrode layer is connected with a connection line which is a part of a peripheral line of a joint interface between the p-type semiconductor layer and the n-type semiconductor layer on an interface side between the second electrode layer and the p-type semiconductor layer, and is formed to be extended on the surface of the n-type semiconductor layer to a position on a control electrode layer side of the connection line.

3. The semiconductor device according to claim 2, wherein a distance from the connection line to a control electrode layer-side end of the second electrode layer on a surface of the second electrode layer that is in contact with the n-type semiconductor layer is equal to or greater than a layer thickness of the n-type semiconductor layer.

4. The semiconductor device according to claim 2, wherein a distance from the connection line to a control electrode layer-side end of the second electrode layer on a surface of the second electrode layer that is in contact with the n-type semiconductor layer is equal to or greater than 0.5 µm but is equal to or less than 20 µm.

5. The semiconductor device according to claim 1, wherein the first electrode layer is connected with a connection line which is a part of a peripheral line of a joint interface between the p-type semiconductor layer and the n-type semiconductor layer on an interface side between the second electrode layer and the p-type semiconductor layer and with a surface of the p-type semiconductor layer.

6. The semiconductor device according to claim 1, wherein the second electrode layer is formed to cover an entire surface of the first electrode layer other than a portion covered with the p-type semiconductor layer and the n-type semiconductor layer.

7. The semiconductor device according to claim 1, further comprising:
    an inter-layer insulator film formed to cover the semiconductor layer and the electrode layer and includes a contact hole that connects with a surface of the second electrode layer; and a wiring electrode layer formed in the contact hole to be connected with the second electrode layer, wherein the second electrode layer is formed to cover a surface of the first electrode layer such that the first electrode layer is isolated from the contact hole.

8. The semiconductor device according to claim 1, wherein the p-type semiconductor layer and the n-type semiconductor layer are formed to include a recess comprising an inner surface defined by the p-type semiconductor layer and the n-type semiconductor layer, and wherein the first electrode layer is formed to cover at least a part of the surface of the n-type semiconductor layer, which defines the inner surface of the recess.

9. The semiconductor device according to claim 1, wherein the second electrode layer is formed to cover a part of a surface of the first electrode layer other than a portion covered with the p-type semiconductor layer and the n-type semiconductor layer.

10. The semiconductor device according to claim 1, wherein the p-type semiconductor layer and the n-type semiconductor layer mainly comprise gallium nitride (GaN).

11. The semiconductor device according to claim 10, wherein the second electrode layer includes a p contact formation layer arranged on a side to be connected with the p-type semiconductor layer, and wherein the p contact formation layer contains at least one metal selected from the group consisting of nickel (Ni), palladium (Pd), and platinum (Pt), or an alloy of the selected metal.

12. The semiconductor device according to claim 11, wherein the p contact formation layer has a layer thickness of not less than 3 nm and not greater than 100 μm.

13. The semiconductor device according to claim 11, wherein the second electrode layer includes a p cap layer arranged on a side of the p contact formation layer that is opposite to a side of the p contact formation layer connected with the p-type semiconductor layer, and wherein the p cap layer contains at least one metal selected from a group consisting of hafnium (Hf), vanadium (V), titanium (Ti), molybdenum (Mo), niobium (Nb), rhodium (Rh), silicon (Si), tantalum (Ta), tungsten (W), zirconium (Zr), iridium (Ir), osmium (Os), rhenium (Re), TiSi, TiN, TiW, TaSi, and TaN, or an alloy of the selected metal.

14. The semiconductor device according to claim 13, wherein the p cap layer has a layer thickness of not less than 3 nm and not greater than 100 μm.

15. The semiconductor device according to claim 11, wherein the first electrode layer includes a first n contact formation layer arranged on a side connected with the n-type semiconductor layer, and a second n contact formation layer arranged on a side of the first n contact formation layer that is opposite to the side of the first n contact formation layer connected with the n-type semiconductor layer, and wherein the first n contact layer contains at least one metal selected from the group consisting of hafnium (Hf), titanium (Ti), and vanadium (V), or an alloy of the selected metal.

16. The semiconductor device according to claim 15, wherein the first n contact formation layer has a layer thickness of not less than 3 nm and not greater than 100nm.

17. The semiconductor device according to claim 15, wherein the second n contact formation layer contains aluminum (Al) or an aluminum (Al) alloy.

18. The semiconductor device according to claim 17, wherein the second n contact formation layer has a layer thickness of not less than 100 nm and not greater than 1000 nm.

19. The semiconductor device according to claim 17, wherein the first electrode layer includes an n barrier layer arranged on a side of the second n contact formation layer that is opposite to the side of the second n contact formation layer connected with the first n contact formation layer, and wherein the n barrier layer contains at least one metal selected from a group consisting of hafnium (Hf), vanadium (V), titanium (Ti), molybdenum (Mo), niobium (Nb), rhodium (Rh), silicon (Si), tantalum (Ta), tungsten (W), zirconium (Zr), iridium (Ir), osmium (Os), rhenium (Re), TiSi, TiN, TiW, TaSi, and TaN, or an alloy of the selected metal.

20. The semiconductor device according to claim 19, wherein the n barrier layer has a layer thickness of not less than 3 nm and not greater than 1000 nm.

21. The semiconductor device according to claim 19, wherein the second electrode layer includes a p contact formation layer arranged on a side connected with the p-type semiconductor layer, and wherein the n barrier layer and the p contact formation layer comprise an identical material.

22. The semiconductor device according to claim 1, wherein the second electrode layer is connected to ground.

23. A power converter, comprising the semiconductor device according to claim 22.

* * * * *